US009292409B2

(12) United States Patent
Hammerschmidt et al.

(10) Patent No.: US 9,292,409 B2
(45) Date of Patent: Mar. 22, 2016

(54) SENSOR INTERFACES

(71) Applicant: Infineon Technologies AG, Neubiberg (DE)

(72) Inventors: Dirk Hammerschmidt, Villach (AT); Peter Hoffmann, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 90 days.

(21) Appl. No.: 13/908,389

(22) Filed: Jun. 3, 2013

(65) Prior Publication Data

US 2014/0358377 A1    Dec. 4, 2014

(51) Int. Cl.
*G06F 11/36* (2006.01)
*B60R 21/01* (2006.01)

(52) U.S. Cl.
CPC ............... *G06F 11/36* (2013.01); *B60R 21/01* (2013.01); *B60R 2021/01054* (2013.01); *B60R 2021/01068* (2013.01)

(58) Field of Classification Search
CPC ............... H04L 29/02–29/06; H04L 29/0602; H04L 29/06088
USPC .............. 701/36, 45; 370/465, 466, 467, 437; 340/870.11, 870.18
See application file for complete search history.

(56) References Cited

U.S. PATENT DOCUMENTS

| 3,761,841 A | 9/1973 | Jacquart |
| 4,646,338 A | 2/1987 | Skillicorn |
| 4,755,816 A | 7/1988 | DeLuca |
| 5,468,126 A | 11/1995 | Lukich |
| 5,550,498 A | 8/1996 | Kwan et al. |

(Continued)

FOREIGN PATENT DOCUMENTS

| CN | 2513286 Y | 9/2002 |
| CN | 101806602 A | 8/2010 |

(Continued)

OTHER PUBLICATIONS

PSI5, Peripheral Sensor Interface for Automotive Applications, Aug. 10, 2012, Technical Specification.*

(Continued)

*Primary Examiner* — Thomas G Black
*Assistant Examiner* — Sara Lewandroski
(74) *Attorney, Agent, or Firm* — Eschweiler & Associates, LLC

(57) ABSTRACT

Some embodiments of the present disclosure relates to an automotive control unit (ACU) able to communicate with sensors using a plurality of different communication protocols. The ACU comprises a control unit that operates a sensor interface module to selectively generate a plurality of control signals corresponding to a plurality of different communication protocols, wherein respective control signals have characteristics corresponding to one of the plurality of different communication protocols. A modulation unit receives one of the control signals and generates a modulated communication signal having characteristics that correspond to a communication protocol of the one of the control signals. A communication bus provides the communication signal to a sensor network comprising one or more sensors. By operating the modulation unit to operate according to different communication protocols the ACU can be operated to communicate with multiple sensors using different communication protocols (e.g., PSI5 and DSI3 communication protocols).

31 Claims, 9 Drawing Sheets

(56) References Cited

U.S. PATENT DOCUMENTS

| | | | |
|---|---|---|---|
| 5,677,618 A | 10/1997 | Fiez et al. | |
| 5,731,694 A | 3/1998 | Wilcox et al. | |
| 5,742,845 A * | 4/1998 | Wagner | G06F 8/33 705/26.1 |
| 5,946,634 A * | 8/1999 | Korpela | H04W 8/245 370/466 |
| 6,064,327 A | 5/2000 | Ryoho et al. | |
| 6,297,691 B1 * | 10/2001 | Anderson | H04L 27/2273 329/300 |
| 6,362,702 B1 | 3/2002 | Nielsen et al. | |
| 6,407,554 B1 * | 6/2002 | Godau | G01R 31/006 324/503 |
| 6,526,340 B1 * | 2/2003 | Reul | G05B 23/027 340/439 |
| 6,556,144 B1 | 4/2003 | Roberts et al. | |
| 6,563,418 B1 * | 5/2003 | Moon | H04L 12/462 340/12.39 |
| 6,608,566 B1 | 8/2003 | Davis | |
| 6,831,431 B1 | 12/2004 | Dieterle et al. | |
| 7,233,645 B2 | 6/2007 | Feda | |
| 7,649,345 B2 | 1/2010 | Kwan | |
| 7,773,016 B2 | 8/2010 | Miao | |
| 7,890,666 B2 * | 2/2011 | Gajo | G06F 13/387 710/11 |
| 8,497,712 B2 | 7/2013 | Nguyen et al. | |
| 8,710,963 B2 | 4/2014 | Hammerschmidt | |
| 8,805,636 B2 * | 8/2014 | Conner | G06F 11/2733 702/119 |
| 8,872,392 B1 | 10/2014 | Gurunathan et al. | |
| 9,026,224 B2 | 5/2015 | Jung et al. | |
| 2002/0128572 A1 | 9/2002 | Chang | |
| 2003/0023328 A1 | 1/2003 | Yasui | |
| 2003/0045972 A1 * | 3/2003 | Remboski | H04L 67/12 701/1 |
| 2005/0109935 A1 * | 5/2005 | Manlove | B60R 21/01516 250/300 |
| 2005/0131595 A1 * | 6/2005 | Luskin | G06Q 50/30 701/31.4 |
| 2005/0146458 A1 * | 7/2005 | Carmichael | G01S 13/867 342/52 |
| 2005/0172058 A1 * | 8/2005 | Brown | G06F 13/4221 710/105 |
| 2005/0194951 A1 | 9/2005 | Mehas et al. | |
| 2006/0129724 A1 * | 6/2006 | Kostadinov | H04L 12/40032 710/106 |
| 2006/0136601 A1 * | 6/2006 | Arora | H04L 69/08 709/246 |
| 2007/0108953 A1 | 5/2007 | Latham | |
| 2007/0260438 A1 * | 11/2007 | Langer | G01M 17/007 703/8 |
| 2008/0123815 A1 | 5/2008 | Feda | |
| 2008/0300750 A1 | 12/2008 | Davis et al. | |
| 2008/0310200 A1 | 12/2008 | Maksimovic et al. | |
| 2009/0076760 A1 | 3/2009 | Schumacher et al. | |
| 2009/0205436 A1 | 8/2009 | Garverick et al. | |
| 2009/0237282 A1 | 9/2009 | Hartlieb et al. | |
| 2009/0241499 A1 | 10/2009 | Maertens et al. | |
| 2009/0292414 A1 * | 11/2009 | Raichle | G07C 5/008 701/31.4 |
| 2009/0302815 A1 | 12/2009 | Tanzawa | |
| 2009/0319060 A1 | 12/2009 | Wojsznis et al. | |
| 2010/0264895 A1 | 10/2010 | Weng et al. | |
| 2011/0309916 A1 | 12/2011 | Mueller et al. | |
| 2012/0056642 A1 | 3/2012 | Song et al. | |
| 2012/0081085 A1 | 4/2012 | Miyamae | |
| 2012/0101595 A1 | 4/2012 | Jung et al. | |
| 2012/0110234 A1 * | 5/2012 | Gruber | G06F 3/162 710/315 |
| 2012/0153917 A1 | 6/2012 | Adell et al. | |
| 2012/0212197 A1 | 8/2012 | Fayed et al. | |
| 2012/0249093 A1 | 10/2012 | Grbo et al. | |
| 2012/0307229 A1 | 12/2012 | Conroy et al. | |
| 2013/0033357 A1 | 2/2013 | Hammerschmidt | |
| 2013/0043908 A1 | 2/2013 | Hammerschmidt | |
| 2013/0063166 A1 | 3/2013 | Ng et al. | |
| 2013/0229197 A1 | 9/2013 | Kusaka et al. | |
| 2013/0342185 A1 | 12/2013 | Kunihiro et al. | |
| 2014/0077982 A1 | 3/2014 | Wu et al. | |
| 2014/0266121 A1 | 9/2014 | Wee et al. | |

FOREIGN PATENT DOCUMENTS

| | | | |
|---|---|---|---|
| DE | 3912439 A1 | 10/1990 | |
| DE | 4228047 A1 | 4/1993 | |
| DE | 10112844 A1 * | 9/2002 | G05B 19/0428 |
| DE | 10340431 A1 | 4/2004 | |
| DE | 102008041030 A1 | 2/2010 | |

OTHER PUBLICATIONS

DSI3, DSI3 Bus Standard Revision 1.00, Feb. 16, 2011, DSI.*
Johnson, HART Communication Networks are Improved by Small, Flexible, Low-Power Modem ICs, Oct. 2012, Analog Dialogue.*
Aragon et al., Power Line Impedance Characterization of Automotive Loads at the Power Line Communication Frequency Range, 2010, MICINN.*
Notice of Allowance dated Dec. 16, 2013 for U.S. Appl. No. 13/046,891. 24 Pages.
Dahono, Pekik Argo. "A Control Method for DC-DC Converter That Has an LCL Output Filter Based on New Virtual Capacitor and Resistor Concepts." 2004 35th Annual IEEE Power Elecfronics Specialists Conference. 7 Pages.
DSI3 Bus Standard. Jul. 2, 2010. 46 Pages.
PSI5 Peripheral Sensor Interface. Peripheral Sensor Interface for Automotive Applications. Jun. 6, 2008. 47 Pages.
Wessels, Christian, et al. "Active Damping of LCL-Filter Resonance based on Virtual Resistor for PWM Rectifiers—Stability Analysis with Different Filter Parameters." Insitute of Power Electronics and Electrical Drives Kaiserstr. 2, 24143 Kiel, Germany. Published in 2008. 7 Pages.
Infineon Technologies. "Differential Two-Wire Hall Effect Sensor IC." Published in Feb. 2002. 18 Pages.
Discrete Semiconductors. "Rotational Speed Sensor for Extended Air Gap Application and Direction Detection." Published on Sep. 4, 2004. 16 Pages.
Infineon Technologies. "TLE4941/4941C Smart Hall Effect ICs for Active Wheel Speed Sensing." Published in 2006. 2 Pages.
U.S. Appl. No. 13/212,463, filed Aug. 18, 2011. 23 Pages.
U.S. Appl. No. 13/197,288, filed Aug. 3, 2011. 22 Pages.
U.S. Appl. No. 13/430,015, filed Mar. 26, 2012. 35 Pages.
U.S. Appl. No. 13/046,891, filed Mar. 14, 2011. 35 Pages.
Non-Final Office Action dated Apr. 25, 2013 for U.S. Appl. No. 13/430,015. 48 Pages.
Micrel : MIC 184 Local/Remote Thermal Supervisor. Firmenschrift, Micrel, Inc.: Data Sheet MIC184, May 2006. San Jose: Micrel, 2006. 20 Pages.
Hägglund, Tore : New Estimation Techniques for Adaptive Control. Doctoral Dissertation, The Swedish Board for Technical Development (STU), Document No. CODEN : LUTFD2/(TFRT-1025)/1-120/(1983). Lund, Sweden : Lund University, Department of Automatic Control, Dec. 1983. 118 Pages.
Final Office Action Dated Jan. 16, 2015 U.S. Appl. No. 13/197,288.
Notice of Allowance Dated Jun. 3, 2014 U.S. Appl. No. 13/430,015.
Office Action Dated Jun. 20, 2014 U.S. Appl. No. 13/197,288.
Non Final Office Action Dated Jul. 16, 2014 U.S. Appl. No. 13/212,463.
Tietze, U. et al. "Electronic Circuits: Design and Applications." ISBN 3-540-50608-X. Berlin, Heidelberg ; New York : Springer. Kapitel 23.6-23.8 : AD-Umsetzer, S. Published in 1991. pp. 690-711.
Non-Final Office Action dated Nov. 8, 2013 for U.S. Appl. No. 13/430,015. 22 Pages.
Office Action dated Jun. 26, 2013 for U.S. Appl. No. 13/046,891.
U.S. Appl. No. 14/248,668, filed Apr. 9, 2014.
Notice of Allowance Dated May 11, 2015 U.S. Appl. No. 13/197,288.
Non Final Office Action Dated Nov. 25, 2015 U.S. Appl. No. 14/248,668.

* cited by examiner

SENSOR INTERFACES

BACKGROUND

Modern vehicles include a vast array of sensors, such as air bag sensors, tire pressure sensors, engine sensors, seat belt sensors, and many others. The sensors provide data about the vehicle's operation (e.g., wheel speed, deceleration, etc.) to an automotive control unit (ACU). Based on the data received from the sensors, the ACU can determine if an action should be taken (e.g., when air bags within a vehicle should be deployed).

FIG. 1 shows a vehicular sensing system 100 including a sensor interface module 102. The sensor interface module 102 has a control unit interface 104 coupled to a control unit 106 and a sensor interface 108 connected to one or more sensors 110 (e.g., 110a, ..., 110n).

To transmit information to the sensors 110, the sensor interface module 102 includes a modulation unit 112, which modulates a supply voltage (e.g., a change in the DC supply voltage) to transmit information to at least one of the sensors 112. When data is not transmitted, the modulation unit 112 often provides an un-modulated (e.g., DC) supply voltage to the sensors 110. To receive information from the sensors 110, the sensor interface module 102 includes a demodulation unit 114, which demodulates a modulated sensor current signal to receive information from at least one of the sensors 110.

DETAILED DESCRIPTION

Figure 1:
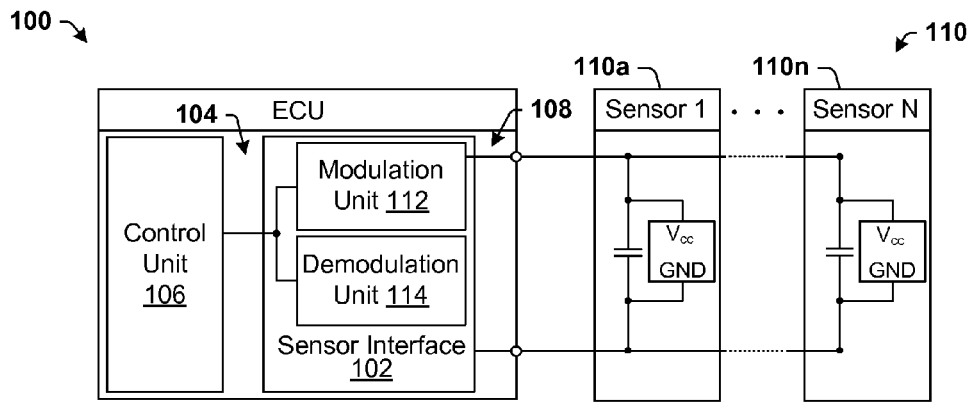
FIG. 1 is a block diagram of a vehicular sensing system.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

Automotive control units (e.g., engine control units, airbag control units, etc.) may be placed in a wide variety of automotive systems. Each automotive system may comprise a different environment in which an automotive control unit (ACU) has to operate. For example, an automotive system may operate according to a number of different sensor interfaces/communication protocols (e.g., a PSI5 or DSI3 communication protocol) or may comprise a load impedance defined by a setup of the automotive system. The different environments of automotive systems present problems for ACUs that are designed to be integrated into a broad range of automotive systems.

For example, conventional ACUs are configured to communicate with sensors according to a single communication protocol. This may be due to differences between different communication protocols. For example, a DSI2 protocol is incompatible with a PSI5 protocol, since features of the two protocols cannot be addressed with same hardware components. If an ACU does not operate using a communication protocol that corresponds to the sensor interface/protocol, the ACU is not able to communicate with sensors in the automotive system.

Similarly, automotive systems may operate with different impedance loads. For example, bus wires that connect an ACU and one or more sensors may have different lengths (e.g., between about 0 and 12 meters) and may be loaded with multiple sensors that can be distributed over the length of the bus wires. The different wire lengths and sensor configurations result in an LC network having serial and parallel resonance frequencies with locations that can vary over orders of magnitude (e.g., between 100 kHz and 50 MHz).

To achieve acceptable results, coefficients of a control algorithm used by a voltage controller within an ACU are chosen according to the load configuration. Unfortunately, the load configuration of an automotive system depends on the configuration of the automotive system and is not known when an ACU is manufactured. Therefore, conventional ACUs use a voltage controller set up with standardized coefficients that work with most load setups. However, such standardized coefficients cause a decrease of the performance of the voltage controller.

Accordingly, the present disclosure relates to an automotive control unit configured to operate according to a plurality of different communication protocols. By operating the modulation unit to operate according to different communication protocols the ACU can be operated to communicate with multiple sensors using different communication protocols (e.g., PSI5 and DSI3 communication protocols). In some embodiments, the disclosed ACU may additionally or alternatively be configured to generate a test signal that is used to characterize sensors connected to an ACU (e.g., to characterize a load impedance or communication protocol of sensors) and to selectively modify operation of the automotive system to improve performance of the sensor network.

Figure 2:
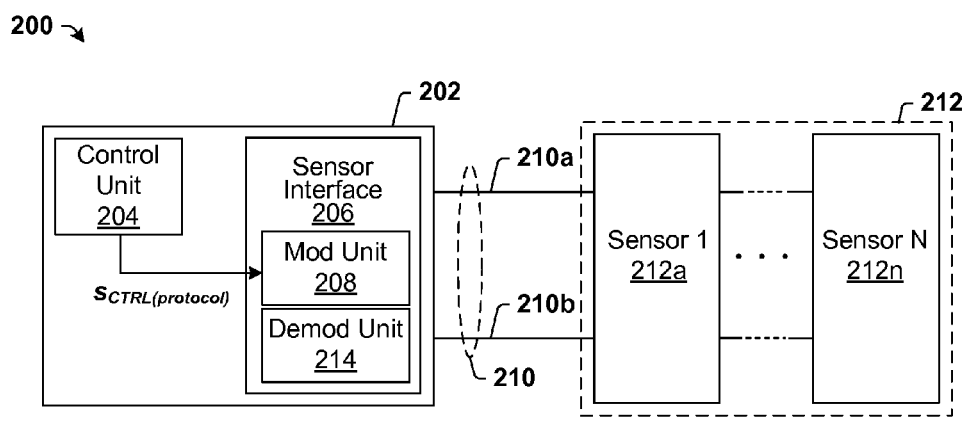
FIG. 2 is a block diagram of a vehicular sensing system comprising an ACU configured to communication with sensors via a plurality of different communication protocols.

FIG. 2 illustrates a block diagram of a vehicular sensing system 200 comprising an ACU 202 configured to communicate with a sensor network 212 having one or more sensors 212a-212n that may operate using different communication protocols.

The ACU 202 is configured to use a same physical sensor interface module 206 to generate and receive the different communication protocols (e.g., PSI5, DSI3, etc.). By using the same physical sensor interface module 206, the ACU 202 can provide the different communication protocols to a sensor network 212 by changing a configuration of the sensor interface module 206.

In some embodiments, the ACU 202 comprises a control unit 204 in communication with the sensor interface module 206 having a modulation unit 208. To receive information from the sensor network 212, the control unit 202 further includes a demodulation unit 214, which demodulates a modulated signal to receive information from at least one of the sensors 110. The control unit 204 is configured to generate control signals $S_{CTRL}$ having a value that is associated with a communication protocol (e.g., PSI5, DSI3, etc.). For example, the control unit 204 may generate a control signal $S_{CTRL}$ having a first value that corresponds to a first communication protocol or a control signal $S_{CTRL}$ having a second value that corresponds to a second communication protocol.

The modulation unit 208 is configured to receive the control signal $S_{CTRL}$ and based thereupon to generate a communication signal that has characteristics corresponding to a communication protocol defined by the control signal $S_{CTRL}$. The communication signal, which is configured to transmit information to the one or more sensors 212a-212n, is provided to the one or more sensors 212a-212n by way of a communication bus 210.

The communication protocols generated by the ACU 202 share common traits on the physical level. In some embodiments, the multiple communication protocols are transmitted using a communication bus 210 having a same number of bus wires. For example, the communication bus 210 may comprise a two wire sensor bus having a first wire 210a and a second wire 210b. In other embodiments, the multiple communication protocols may transmit data transmission signals via voltage modulation and receive sensor data via current modulation (e.g., a change in supply current drawn by the sensor), or vice versa. For example, the modulation unit 208 may be configured to generate a communication signal comprising a modulated supply voltage (e.g., a change in the DC supply voltage) or a modulated current.

ACU 202 may determine a type of communication protocol used by the one or more sensors 212a-212n in a variety of ways. In some embodiments, a communication protocol may be set by a microcontroller that causes the ACU 202 to operate according to the communication protocol. For example, after the ACU 202 is integrated into an automotive system, a microcontroller may send a command to the control unit 204 that defines a communication protocol of the automotive system. In other embodiments, the ACU 202 may initially generate communication signals using a first communication protocol, and if the ACU 202 receives an error signal from the one or more sensors 212a-212n it will change to generate communication signals using another, second communication protocol.

Since the ACU 202 is able to generate communication signals having different communication protocols, the ACU 202 is able to communicate with the one or more sensors 212a-212n using different communication protocols, thereby allowing the ACU 202 to be integrated into a plurality of different automotive sensors systems without having to pre-determine the communication protocol of a given system. For example, in some embodiments ACU 202 can be integrated into an airbag sensor system that operates according to a PSI5 communication protocol. In alternative embodiments, the ACU 202 can be integrated into a power steering sensor system that operates according to a DSI3 protocol. In another alternative embodiment, the ACU 202 may have multiple transceivers wherein each the transceivers is controlled by a separate control signal ($S_{ctrl1} \ldots S_{ctrlN}$). Using the separate control signals, the ACU 202 assigns a part of the transceivers to a first protocol (e.g., PSI5) and the remaining transceivers to another protocol (e.g., DSI3).

Figure 3:
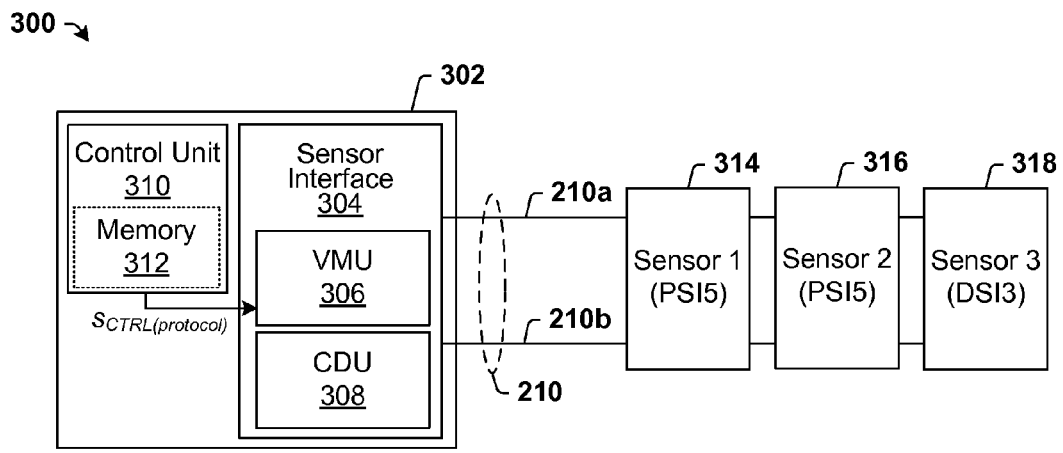
FIG. 3 is a block diagram of a vehicular sensor system comprising a plurality of sensors that use PSI5 and/or DSI3 communication protocols.

FIG. 3 illustrates a vehicular sensor system 300 comprising a plurality of sensors 314-318 that use standardized Peripheral Sensor Interface 5 (PSI5) and/or Distributed System Interface3 (DSI3) protocols for an airbag sensor system having an airbag control unit configured to control operation of airbags within an automobile.

In vehicular sensor system 300, an airbag control unit 302 comprises a control unit 304 configured to control operation of a sensor interface module 304 comprising a voltage modulation unit 306 and a current demodulation unit 308. The voltage modulation unit 306 is configured to generate a communication signal comprising a modulated voltage. The current demodulation unit 308 is configured to demodulate a modulated current received from the plurality of sensors 314-318.

The ACU 302 is connected to a plurality of sensors 314-318 by way of a communication bus 210 (e.g., a two wire communication bus). In some embodiments, the plurality of sensors 314-318 may use a single communication protocol. For example, in some embodiments, the plurality of sensors 314-318 may use a PSI5 communication protocol or a DSI3 communication protocol. In other embodiments, the plurality of sensors 314-318 may use different communication protocols. For example, the communication bus 210 may connect the airbag control unit 302 to a first sensor 314 and a second sensor 316 configured to use a PSI5 communication protocol and to a third sensor 318 configured to use a DSI3 communication protocol.

Since the PSI5 and DSI3 communication protocols share a plurality of characteristics on the physical level, airbag control unit 302 is able to generate communication signals for both the PSI5 and DSI3 communication protocols using a same hardware. For example, both the PSI5 and DSI3 communication protocols are attached to the plurality of sensors 314-318 via a two wire communication bus 210. Furthermore, both the PSI5 and DSI3 communication protocols communicate with the plurality of sensors 314-318 via voltage modulation (performed by modulation unit 306) and receive information from sensors via current demodulation (performed by demodulation unit 308).

In some embodiments, the control unit 310 may be configured to run different software instructions, stored in memory 312, to generate a control signal $S_{CTRL}$ corresponding to the PSI5 and DSI3 communication protocols. For example, the control unit 310 may run a first set of software instructions that defines a control signal $S_{CTRL}$ having a value that operates the voltage modulation unit 306 to generate a PSI5 communication signal or the control unit 310 may run a second set of software instructions that defines a control signal $S_{CTRL}$ having a value that operates the voltage modulation unit 306 to generate a DSI3 communication signal. The control signals $S_{CTRL}$ may also be used to configure some time slots in which the sensor interface module 304 acts as a receiver to decode a current modulated sensor signal according to the PSI5 protocol and other time slots in which the sensor interface module 304 acts as a receiver to decode incoming messages according to the DSI3 protocol.

Figure 4:
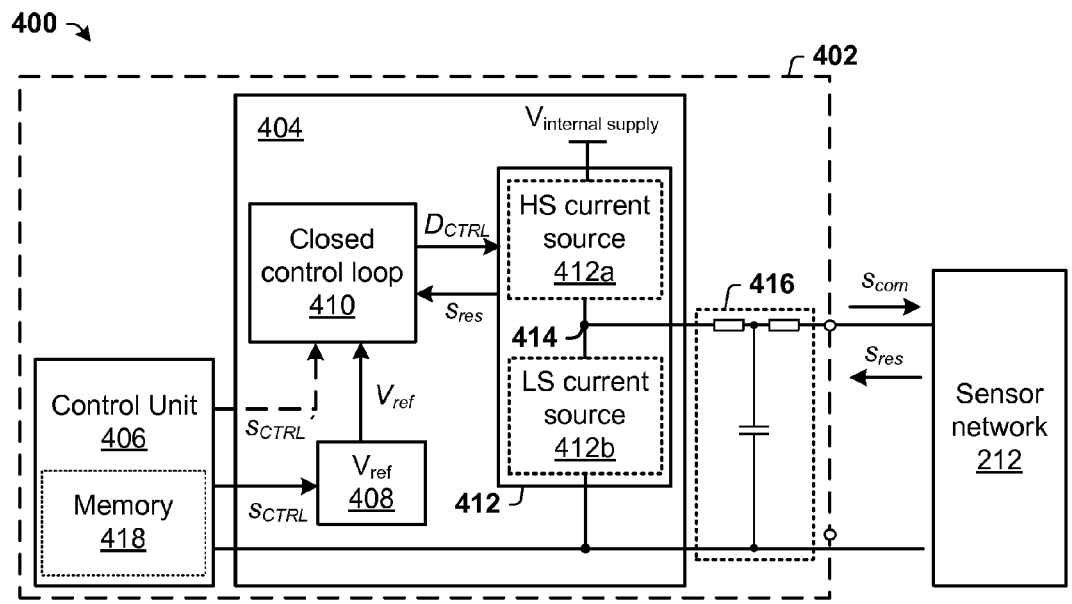
FIG. 4 illustrates a more detailed embodiment of an ACU configured to communication with sensors via a plurality of different communication protocols.

FIG. 4 illustrates a vehicular sensor system 400 having a more detailed embodiment of a disclosed automotive control unit (ACU) 402 configured to operate according to multiple communication protocols.

The ACU 402 comprises a sensor interface module 404 having a reference voltage source 408 configured to receive a control signal $S_{CTRL}$ from the control unit 406 and to generate a variable reference signal $V_{ref}$ based thereupon. The reference voltage source 408 is coupled to a closed control loop 410 that generates a digital control signal $D_{CTRL}$ based upon the variable reference voltage $V_{ref}$. The digital control signal $D_{CTRL}$ is provided to an output driver stage 412 that regulates an output voltage at output node 414.

The output driver stage 412 comprises a high-side current source 412a and a low-side current source 412b. To increase the output voltage at output node 414, the current generated by the high-side current source 412a may be increased. Alternatively, to decrease the output voltage at output node 414, the current generated by the high-side current source 412a may be decreased and/or the current generated by the low-side current source 412b may be increased. In some embodiments, to limit noise and attenuate the line resonance, an RLC network 416 may be coupled to the sensor interface module 404.

The control unit 402 is configured to selectively operate the sensor interface module 404 to generate communication signals $S_{com}$ according to a plurality of different communication protocols. The communication signals $S_{com}$ are subsequently provided to a sensor network 212 comprising one or more sensors. In some embodiments, the control unit 406 is configured to operate the output driver stage 412 to generate a communication signal $S_{com}$ by varying the reference voltage $V_{ref}$ output by the reference voltage source 408. Varying the reference voltage $V_{ref}$ causes the output voltage at output node 414 to vary in a manner consistent with a communication protocol. In other embodiments, the control unit 402 is configured to operate the output driver stage 412 to generate a communication signal $S_{com}$ by generating a supplemental control signal $S_{CTRL}'$ that is introduced directly into the closed control loop 410. The supplement control signal $S_{CTRL}'$ is configured to modify the value of the control signal $D_{CTRL}$ so as to vary the output voltage at output node 414 in a manner consistent with a communication protocol. In some embodiments, the supplemental control signal $S_{CTRL}'$ may vary a digital value of the control signal $S_{CTRL}$.

In some embodiments, the different communication protocols may have different synchronization pulses. For example, in airbag systems, a PSI5 communication protocol may comprise a synchronization pulse having an initial voltage modulation with a positive slope, while a DSI3 synchronization pulse may comprise a synchronization pulse having an initial voltage modulation with a negative slope. Therefore, to communicate using a PSI5 communication protocol the control unit 406 may vary the output voltage at output node 414 so that the communication signal comprises synchronization pulses having a voltage that initially rises. Alternatively, to communicate using a DSI3 communication protocol the control unit 406 may vary the output voltage at output node 414 so that the communication signal comprises synchronization pulses having a voltage that initially falls.

In other embodiments, the different communication protocols may have different data rates. For example, in a power train system, a PSI5 or DSI3 communication protocol may be defined by a synchronization pulse length and a gap size between synchronization pulses. Therefore, the control unit 406 may vary the output voltage at output node 414 so that the communication signal has synchronization pulses having a length or gap size specific to a communication protocol.

In some embodiments, the control unit 406 may comprise a memory element 418 configured to store multiple sets of modulation characteristics (e.g., timing of synchronization pulses, a length of a synchronization pulses, etc), which respectively correspond to different communication protocols. The control unit 402 is configured to generate a control signal $S_{CTRL}$ based upon a set of modulation characteristics stored in the memory element 418, which corresponds to a communication protocol. For example, the control unit 402 may generate a first control signal (e.g., having a first digital value which corresponds to a PSI3 communication protocol) based upon a first set of modulation characteristics stored in the memory element 418 or a second control signal (e.g., having a second digital value which correspond to a DSI5 communication protocol) based upon a first set of modulation characteristics stored in the memory element 418.

Figure 5A:
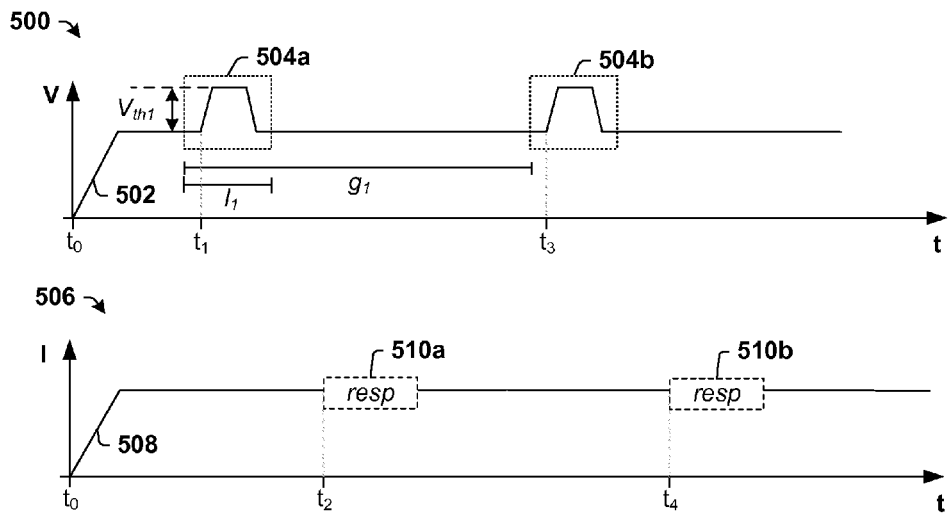
FIGS. 5A-5B illustrates timing diagrams showing various embodiments of operation of a disclosed ACU for different communication protocols.
Figure 5B:
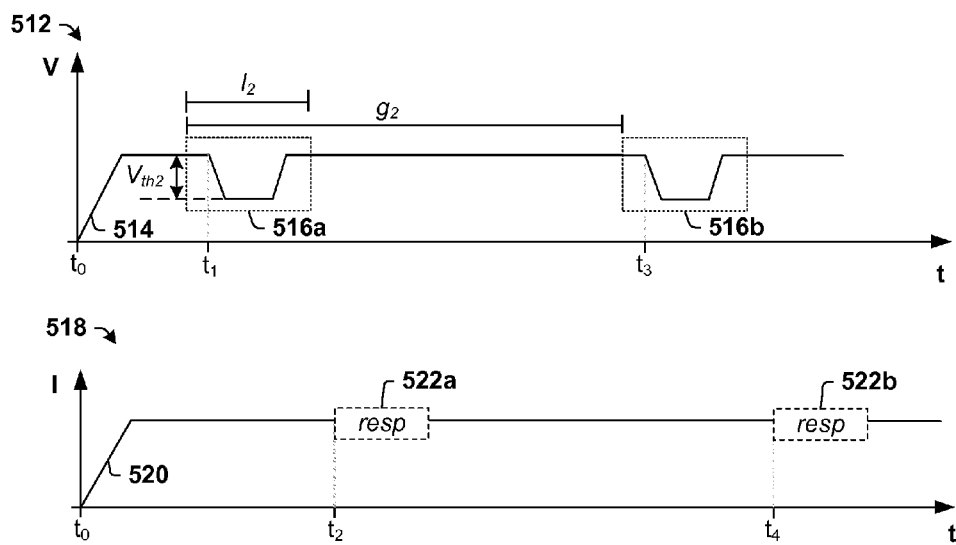

FIGS. 5A-5B illustrate timing diagrams showing exemplary operations of a disclosed ACU (e.g., corresponding to ACU 202). The timing diagrams illustrate how a disclosed control unit may vary operation of an ACU to generate communication signals according to different communication protocols.

FIG. 5A illustrates timing diagrams, 500 and 506, showing some examples of the operation of an ACU for a PSI5 communication protocol.

Timing diagram 500 illustrates a communication signal, using a PSI5 protocol, generated by a disclosed ACU. At time $t_0$, the ACU is turned on and the ACU begins to transmit a communication signal 502 comprising a modulated voltage to one or more sensors. At a time $t_1$, a first synchronization pulse 504a is generated. The first synchronization pulse 504a comprises a modulated voltage that increases by a voltage value greater than $V_{th1}$. The increase in voltage by a voltage value greater than $V_{th1}$ indicates that a PSI5 communication protocol is being used. The first synchronization pulse 504a also has a length $I_1$ defined according to the PSI5 communication protocol.

At time $t_2$, a first response 510a (e.g., data packet), comprising a modulated current 508, is received from a sensor. The first response 510a indicates that the sensor uses the PSI5 communication protocol, since if the sensor did not use a PSI5 communication protocol it would not respond to the first synchronization pulse 504a and no response would be received. At time $t_3$, a second synchronization pulse 504b is transmitted. The time gap $g_1$ between the first synchronization pulse 504a and the second synchronization pulse 504b (i.e., $g_1=t_3-t_1$) is defined to have a value according to the PSI5 communication protocol.

FIG. 5B illustrates timing diagrams, 512 and 518, showing some examples of the operation of an ACU for a DSI3 communication protocol.

Timing diagram 512 illustrates a communication signal, using to a DSI3 protocol, generated by a disclosed ACU. At time $t_0$, the ACU is turned on and the ACU begins to transmit a communication signal 514 comprising a modulated voltage to one or more sensors. At a time $t_2$, a first synchronization pulse 516a is generated. The first synchronization pulse 516a comprises a modulated voltage that decreases by a voltage value greater than $V_{th2}$. The decrease in voltage by a voltage value greater than $V_{th2}$ indicates that a DSI3 communication protocol is being used. The first synchronization pulse 516a has a length $l_2$ defined according to the DSI3 protocol.

At time $t_5$, a first response 522a, comprising a modulated current 520, is received from a sensor. The first response 522a indicates that the sensor uses a DSI3 communication protocol since if the sensor did not use a DSI3 communication protocol it would not respond to the first synchronization pulse 516a. At time $t_5$, a second synchronization pulse 516b is transmitted. The time gap $g_2$ between the first synchronization pulse 516a and the second synchronization pulse 516b (i.e., $g_2 = t_1 - t_3$) is defined to have a value according to the DSI3 communication protocol.

Figure 6:
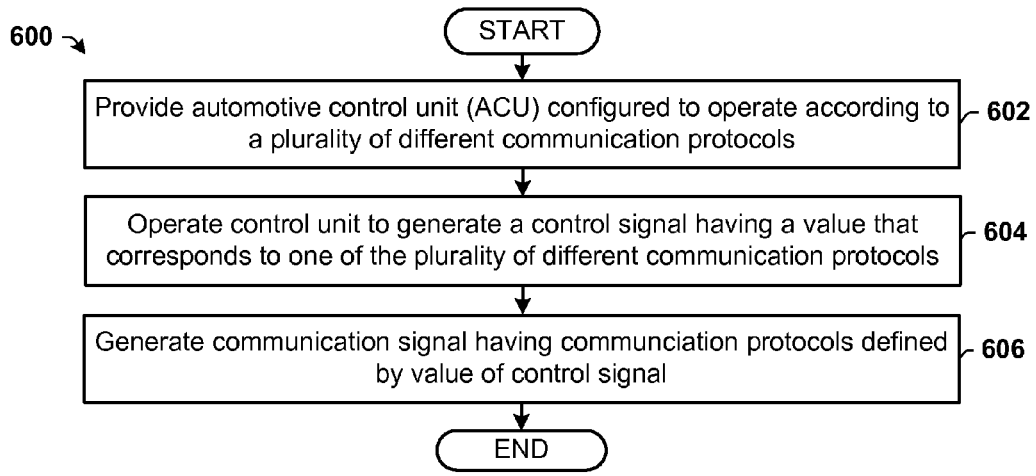
FIG. 6 illustrates a method of operating an ACU to provide communication signals having different communication protocols.

FIG. 6 illustrates an exemplary method 600 of operating a control unit to provide communication signals having different communication protocols.

While the disclosed methods (e.g., methods 600, 800, and 900) are illustrated and described below as a series of acts or events, it will be appreciated that the illustrated order of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, an automotive control unit (ACU) is provided having a control unit configured to operate according to a plurality of different communication protocols. For example, the ACU may be configured to operate according to a first communication protocols and or to a second communication protocol.

At 604, the control unit is operated to generate control signals according to one of the plurality of different communication protocols. The control signals have values respectively associated with one of a plurality of different communication protocols. For example, the control unit may be operated to generate a control signal having a first value corresponding to a first communication protocols and a second control signal having a second value corresponding to a second communication protocol. By generating control signals corresponding to different communication protocols, the ACU is able to be connected to sensors operating at different communication protocols.

At 606, a communication signal having a protocol corresponding to a value of the control signal is generated. For a first value of the control signal a communication signal having a first communication protocol may be generated, while for a second value of the control signal a communication signal having a second communication protocol may be generated.

Figure 7:
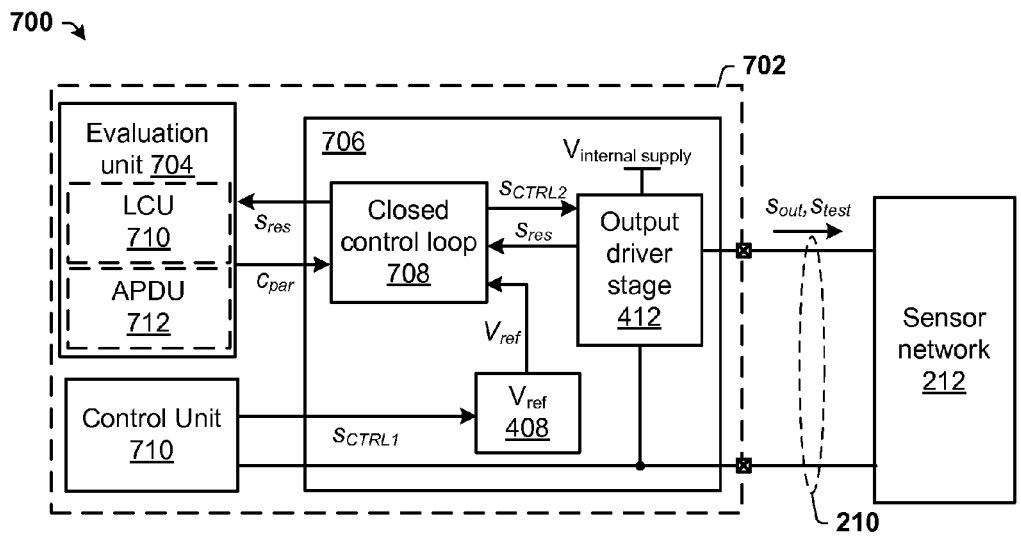
FIG. 7 illustrates a block diagram of a vehicular sensor system having an ACU comprising an evaluation unit configured to characterize a sensor network of an automotive system.

FIG. 7 illustrates a block diagram of some embodiments of a disclosed vehicular sensor system 700 having an ACU 702 comprising an evaluation unit 704 configured to characterize a sensor network 212 of an automotive system.

Although, FIG. 7 describes the evaluation unit 704 as being integrated with a control unit 714 configured to operate according to a plurality of different communication protocols, it will be appreciated that the evaluation unit 704 may also be integrated with a control unit 714 that does not operate according to a plurality of different communication protocols.

The evaluation unit 704 is in communication with the closed control loop 708. The evaluation unit 704 is configured to operate the sensor interface module 706 (e.g., via control unit 716) to generate a test signal $s_{test}$ that is provided to the sensor network 212. The evaluation unit 704 may be configured to characterize the sensor network using the test signal $s_{test}$ to automatically detect a communication protocol being used by one or more sensors of a sensor network 212 and/or to determine an electrical behavior (e.g., load characteristics) of the one or more sensors.

In some embodiments, the evaluation unit 704 comprises a load characterization unit 710 configured to generate a test signal $s_{test}$ configured to characterize a load of the sensor network 212. In such embodiments, the evaluation unit 704 may send the test signal $s_{test}$, comprising a modulated voltage or current, during time windows in which data is not being received from the sensor network 212. The sensor network 212 is configured to induce a response $s_{res}$ to the test signal $s_{test}$ that is provided to the evaluation unit 704. The response $s_{res}$ is indicative of characteristics of the sensor network 212.

The evaluation unit 704 is configured to characterize the electrical behavior of the sensor network 212 based upon the response $s_{res}$. In some embodiments, the evaluation unit 704 may measure the response $s_{res}$ and from the measured response generate one or more parameters that describe the sensor network 212. For example, from a measured response, the evaluation unit 704 may generate a capacitive value, an inductive value, and/or a resistive value of the sensor network 212.

The evaluation unit 704 be further configured to adjust operation of the closed control loop 708 based upon the characterization. In some embodiments, the evaluation unit 704 may adjust operation of the closed control loop 708 by comparing the characterization to equations or lookup tables to generate one or more control parameters $c_{par}$ that define an optimized controller setup. The one or more control parameters $c_{par}$ are subsequently provided to the closed control loop 708 to optimize operation. In other embodiments, the evaluation unit 704 may operate to improve operating conditions according to an iterative process. In such an embodiment, the evaluation unit 704 may iteratively change one or more control parameters $c_{par}$ to search for limits in the control parameters $c_{par}$ where oscillations start. Once a stable range is identified, the final operation setting could be chosen with sufficient margin towards the limits.

In other embodiments, the evaluation unit 704 comprises an automatic protocol detector unit 712 configured to automatically determine a communication protocol being used by the sensor network 212. The automatic protocol detector unit 712 is configured to operate the sensor interface module 706 (e.g., via control unit 716) to generate a plurality of test signals $S_{test}$ (e.g., a synchronization pulse or a command/message), respectively corresponding different protocols (e.g., PSI5, DSI3, etc.). In some embodiments, the automatic protocol detector unit 712 may be programmed to cycle through a sequence of known communication protocols. In such embodiments, the timing of the testing and/or the length of the test signals $s_{test}$ may be set by the programming.

If the test signal $s_{test}$ matches a communication protocols used by one or more sensors within the sensor network 212, the one or more sensors will respond to the test signals. Therefore, if the sensor network 212 responds to the stimulus, the evaluation unit 704 can conclude that one or more sensors within the connected sensor network 212 is using the known protocol. For example, a sensor using a PSI5 communication protocols will respond if it receives a synchronization pulse having an initially rising voltage, but it will not respond if it receives a synchronization pulse having an initially falling voltage. Similarly, a sensor using a DSI3 communication protocols will respond if it receives a synchronization pulse having an initially falling voltage, but it will not respond if it receives a synchronization pulse having an initially rising voltage.

In one embodiment, the evaluation unit 704 may operate the sensor interface module 706 to output a test signal $S_{test}$ comprising synchronization signals corresponding to a first one of a plurality of known protocols. If the evaluation unit 704 receives a response from the sensor network 212, it can determine that the first one of the plurality of known communication protocols is being used by the sensor network 212. If the evaluation unit 704 does not receive a response from the sensor network 212 within a predefined time period, it can generate a test signal $S_{test}$ having synchronization signals corresponding to a second one of the plurality of known communication protocols. If the evaluation unit 704 receives a response from the sensor network 212, it can determine that the second one of the plurality of known communication protocols is being used by the sensor network 212. If the evaluation unit 704 does not receive a response from the sensor network 212 within a predefined time period, it can continue to send additional test signals until a communication protocol of the sensor network 212 is identified.

In some embodiments, the evaluation unit 704 is configured to initially send a test signal $S_{test}$ having a synchronization pulse with a decreasing voltage since a test signal $S_{test}$ having a synchronization pulse with an increasing voltage could harm DSI3 sensors not configured to handle PSI5 pulses. The evaluation unit 704 will wait for a response from the sensor network 212. If the sensor network comprises PSI5 sensors, no response is sent and the evaluation unit 704 is configured to send a subsequent test signal $S_{test}$ having a synchronization pulse with an increasing voltage.

Figure 8:
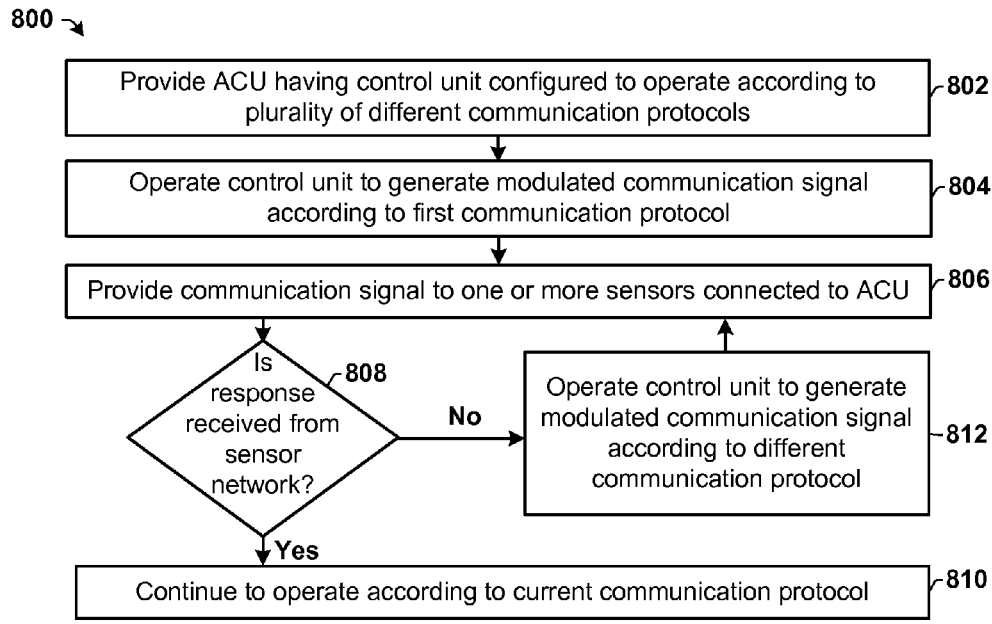
FIG. 8 is a flow diagram showing some embodiments of a method of automatically detecting a communication protocol being used by sensors connected to the ACU.

FIG. 8 illustrates a method 800 of operating an ACU configured to automatically detect a communication protocol being used by sensors connected to the ACU.

At 802, an automotive control unit (ACU) is provided having a control unit configured to operate according to a plurality of different communication protocols.

At 804, the control unit is operated to generate a communication signal according to a first communication protocol. In some embodiments, the first communication protocol may comprise a DSI3 communication protocol.

At 806, the communication signal is provided to one or more sensors connected to the ACU.

In the case that sensor networks are homogenously equipped with sensors of a same protocol, if a response is received from one or more sensors (at 808), the ACU continues to operate according to the current communication protocol, at 810, and the method 800 ends. However, if a response is not received from one or more sensors (at 808), the communication protocol is switched to generate a modulated communication signal according to a different communication protocol, at 812. The method 800 then returns to 806, where the different communication signal is provided to one or more sensors.

Figure 9:
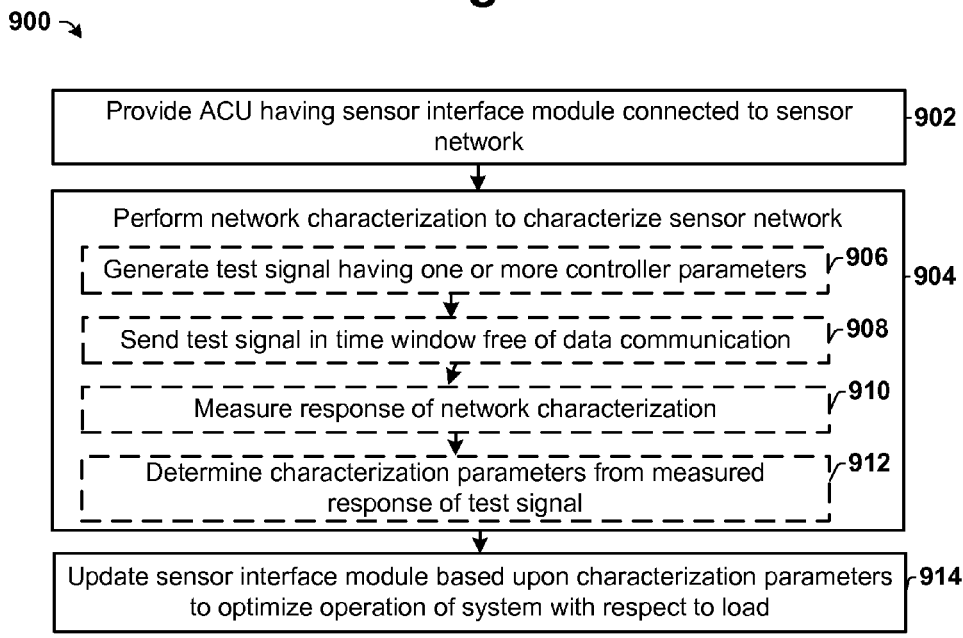
FIG. 9 is a flow diagram showing some embodiments of a method of characterizing load characteristics of a sensor network.

Alternatively, in the case that the sensor networks are not homogenously equipped with sensors of a same protocol (e.g., as shown in FIG. 3), the method 800 would iteratively perform acts 804-810 to test for a set of possible communication protocols defined within a control unit. For example, the method would test perform acts 804-810 to test for a set of possible communication protocols comprising a first communication protocol, a second communication protocol, etc., FIG. 9 is a flow diagram showing some embodiments of a method 900 of characterizing a sensor network to determine load characteristics of a sensor network connected to an ACU.

At 902, an automotive control unit (ACU) having a sensor interface module connected to a sensor network comprising one or more sensors is provided. In some embodiments, the ACU may comprise a control unit configured to operate according to a plurality of different communication protocols. In embodiments, the ACU may comprise a control unit configured to operate according to a single communication protocols.

At 904, a network characterization is performed to characterize the sensor network. The network characterization comprises characterization of the sensor network by determining one or more parameters that describe the impedance load. In various embodiments, the one or more parameters may comprise a complex impedance of the load, one or more components of an equivalent network that describes the impedance load, or one or more components of a transfer function that describes the impedance load. In some embodiments, the network characterization is performed by acts 906-912. In some embodiments, the characterization phase can be split over several characterization slots having multiple iterations and may use different signal types.

At 906, a test signal is generated. In some embodiments, the test signal may comprise a test signal configured to characterize a load impedance of the sensor network. The test signals can be changes of the supplied current (i.e., a current modulation) or changes of the supply voltage (i.e., a voltage modulation). The network response in the case of a test current is a change of the supply voltage and in case of a supply voltage change the response is a variation of the current drawn by the sensor network.

At 908, the test signal is sent during an open time window free of data communications. In some embodiments, once an open time window has been identified, a supply voltage is overlaid onto the output signal to generate a test signal.

At 910, a response of the network characterization is measured. The response may comprise a response induced by the sensor network in response to the test signal. In some embodiments, the sensor network may be active during the network characterization, so that operation points of the sensors have an influence on damping effects in the network.

At 912, one or more characterization parameters are determined based upon measured response of test signal. In some embodiments, the characterization parameters may be determined by fitting an equivalent network to the measured response.

At 914, the sensor interface module is updated based upon the characterization parameters. In some embodiments, the sensor interface module may be updated to optimize operation of the sensor interface module based upon the determined characterization parameters.

Figure 10:
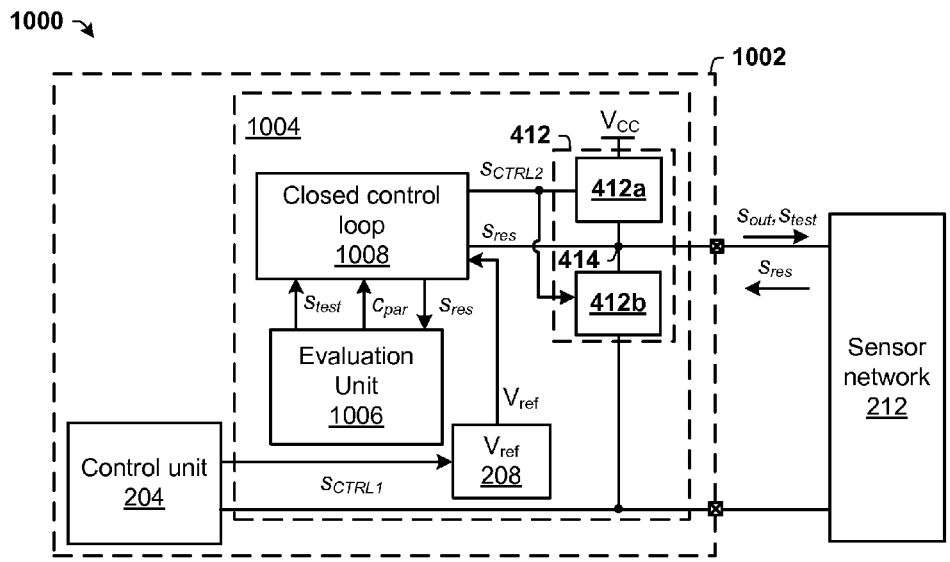
FIG. 10 is a block diagram of some additional embodiments of an automotive control unit configured to characterize an impedance load of a sensor network.

FIG. 10 illustrates a block diagram of some additional embodiments of a vehicular sensor system 1000 having an automotive control unit (ACU) 1002 configured to characterize an impedance load of a sensor network 212.

The ACU 1002 comprises sensor interface module 1004 having an evaluation unit 1006 configured to selectively modify operation of the closed control loop 1008 to control a value of the second control signal $S_{CTRL2}$ in a manner that operates the output driver stage 412 to generate a test signal $s_{test}$. Based upon a response $s_{res}$ to the test signal $s_{test}$, the evaluation unit 1006 may characterize the sensor network 212 to determine information about actual load settings of the sensor network 212. In some embodiments, the evaluation unit 1006 may be configured to change the supply voltage output from the output driver stage 412. Since the change in the supply voltage forces a change of a current returned from the sensor network 212, a transfer function of the sensor network 212 can be calculated by characterizing a change of the response current corresponding to a change of the voltage. In other embodiments, the evaluation unit 1006 may be configured to change the current output from the ACU 1002 and to measure a load voltage induced by the sensor network 212. From the voltage and current information, the impedance can be calculated (e.g., by dividing the voltage by the current).

In some embodiments, the evaluation unit 1006 may selectively modify operation of the closed control loop 1008 by providing one or more control parameters $c_{par}$ to the closed control loop 1008 so that the closed control loop 1008 generates a second control signal $S_{CTRL2}$ that causes the output driver stage 412 to generate the test signal $s_{test}$. In some embodiments, the evaluation unit 1006 may dynamically vary control parameters $c_{par}$ so that the closed control loop 1008 operates using different control parameters during different times. For example, the closed control loop 1008 may operate according to a first set of control parameters to generate the test signal $s_{test}$. After a characterization has been performed, the closed control loop 1008 may operate according to a second set of control parameters that are configured to provide an output signal having optimized settings based upon achieved bus knowledge.

In some embodiments, the evaluation unit 1006 is configured to dynamically characterize the sensor network 212. For example, the evaluation unit 1006 may perform a first characterization (e.g., send a first test signal and receive a first response) during a first time window between synchronization signals and adjust operation of the closed control loop 1008 based upon the characterization. The evaluation unit 1006 may later perform a second characterization during a second time window, after the first time window, and adjust operation of the closed control loop 1008 based upon the first and second characterizations. By dynamically characterizing the sensor network 212, the evaluation unit 1006 can adjust for changes to the sensor network 212 (e.g., due to temperature changes, sensor damage, etc.).

In some embodiments, the test signal $s_{test}$ may comprise a modulated voltage having a voltage variation value smaller than that of a synchronization pulse so that the modulated voltage is insufficient to induce a reaction from the sensor network 212 (i.e., so that the sensor will remain in a static state of operation). For example, the evaluation unit 1006 may operate the closed control loop 1008 to change the supply current of the high-side or low-side current sources, 412a or 412b, to generate a modulated voltage. The response of the sensor network 212 to the modulated voltage is a change the current drawn by the sensor network 212. In other embodiments, the test signal $s_{test}$ may comprise a modulated current. The response of the sensor network 212 to the modulated current is a change of the supply voltage.

In various embodiments, the evaluation unit 1006 may characterize a load response of the sensor network 212 according to one or more characterization parameters. In some embodiments, the one or more characterization parameters may comprise a complex impedance of the sensor network 212. In other embodiments, the one or more characterization parameters may comprise electrical parameters of an equivalent network of the sensor network 212. For example, a measured response may be applied to an equivalent network and one or more characterization parameters (e.g., capacitance, inductance, resistance, etc.) of the equivalent network may be extracted to characterize the sensor network 212. In yet other embodiments, the one or more characterization parameters may correspond to a transfer function configured to model operation of the sensor network 212.

Based upon the characterization, the evaluation unit 1006 may adjust one or more controller parameters $c_{par}$ to adapt the closed control loop 1008 to characteristics of the actually connected sensor network (i.e., to change the closed control loop 1008 from operating with standardized coefficients that work with most load setups to specific coefficients that provide for an improved performance of the voltage controller).

Figure 11A:
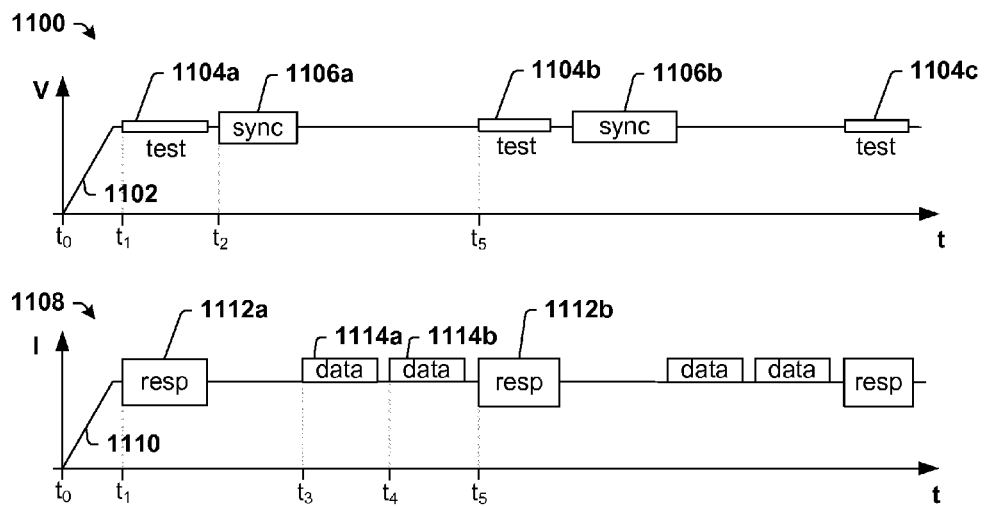
FIGS. 11A-11C illustrate timing diagrams showing some embodiments of operation of a disclosed automotive control unit configured to an impedance load of a sensor network.
Figure 11B:
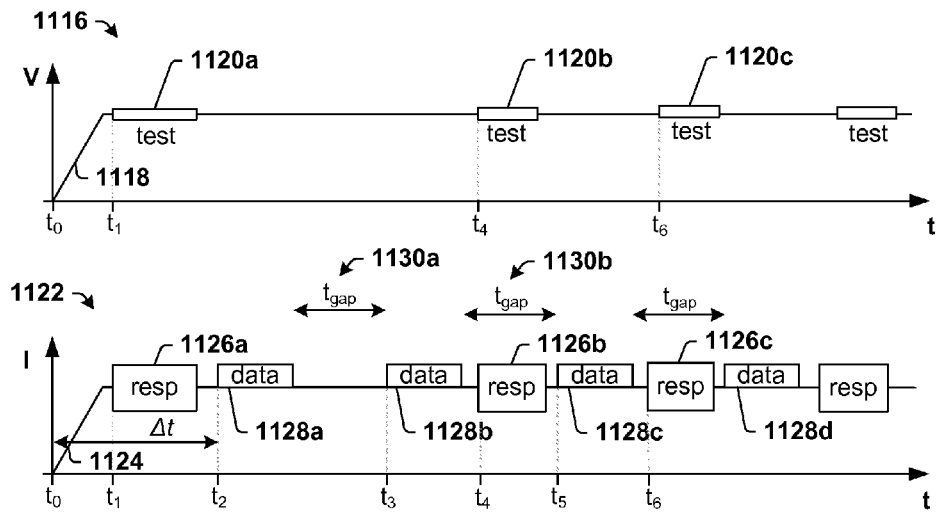
Figure 11C:
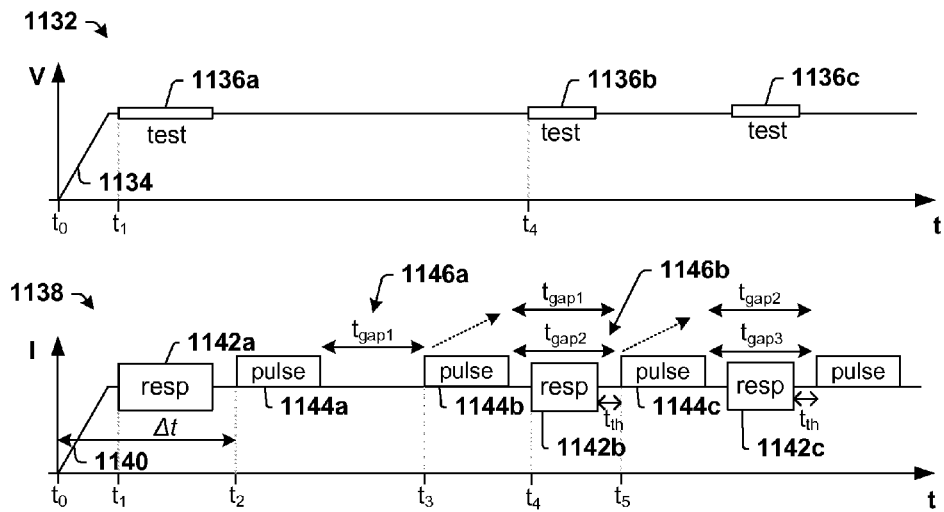

FIGS. 11A-11C illustrate timing diagrams showing operation of a disclosed automotive control unit for different bus modes (e.g., for synchronous and asynchronous bus modes).

FIG. 11A illustrates timing diagrams, 1100 and 1108, showing operation of a disclosed automotive control unit configured to determine an impedance load of a sensor network using a synchronous bus mode. Timing diagram 1100 illustrates a communication signal, comprising a modulated voltage, generated by a disclosed ACU. Timing diagram 1108 illustrates a response, comprising a modulated current, induced by a sensor network in response to the modulated voltage.

It will be appreciated that in a synchronous bus mode, a voltage can be varied without a response from a sensor network (i.e., while keeping a sensor passive) as long as the voltage variation voltage variation does not exceed a minimum amplitude of a specification of a synchronization pulse. Therefore, the sensor interface module may send a test signal 1104 within a time window between synchronization pulses 1106 without inducing a response from a sensor (i.e., during time windows free of data communication).

At time $t_0$, the ACU is turned on and the ACU begins to transmit a communication signal 1102 comprising a modulated voltage to one or more sensors. In some embodiments, before a first synchronization pulse 1106a is sent an initial characterization can be performed by sending a first test signal 1104a comprising a modulated voltage, at time $t_1$. The first test signal 1104a induces a first response 1112a indicative of a load of the sensor network.

At a time $t_2$, a first synchronization pulse 1106a is generated. The first synchronization pulse 1106a comprises a modulated voltage that increases by a voltage value greater than a minimum amplitude of a specification of a synchronization pulse. After sending the first synchronization pulse 1106a, a first data packet 1114a is received from a first sensor, at time $t_3$. The first data packet 1114a comprises a current signal that a sensor interface module receives from a sensor. If the ACU is connected to multiple sensors, multiple data packets will be received (e.g., one from each sensor). For example, an ACU connected to two sensors would also receive a second data packet 1114b is received from a second sensor, at time $t_4$.

Before sending a second synchronization pulse 1106b, the communication bus will be quiet. During the quiet time, a second test signal 1104b may be output from the ACU, at time $t_5$. The second test signal 1104b induces a second response 1112b indicative of the load of the sensor network. During subsequent time windows (between synchronization pulses) additional test signals may be sent to further characterize the sensor network.

If a size of the time window is not sufficient to perform a total bus characterization procedure, the bus characterization procedure may be done over several time windows. For example, information for reconfiguration of the ACU may be obtained from a combination of the first test signal 1104a, a second test signal 1104b sent after the first synchronization pulse 1106a, a third test signal 1104c sent after the second synchronization pulse 1106b, etc. In some embodiments, sensors may be active during the network characterization, since it may be assumed that the operation points of the sensors have an influence on damping effects in the sensor network.

FIG. 11B illustrates timing diagrams, 1116 and 1122, showing operation of a disclosed automotive control unit configured to determine an impedance load response of a sensor network using an asynchronous protocol. Timing diagram 1116 illustrates a communication signal, comprising a modulated voltage, generated by a disclosed ACU. Timing diagram 1122 illustrates a response, comprising a modulated current, induced by a sensor network in response to the modulated voltage.

At time $t_0$, the ACU is turned on and the ACU begins to transmit a communication signal 1118 comprising a modulated voltage to one or more sensors. As illustrated in FIG. 11B, a sensor waits for a certain time Δt (e.g., defined from time $t_0$) after receiving a supply voltage and then automatically transmits a first data packet 1128a. The first data packet 1128a has a defined data rate (e.g., a data frame length, a gap length, etc.). In some embodiments, an initial characterization can be performed before the first data packet 1128a is sent by generating a first test signal 1120a as a modulated voltage, at time $t_1$. In response to the first test signal 1120a, a first response 1126a comprising a modulated current, is induced by the sensors.

At time $t_2$, the first data packet 1128a is received from the sensors. After the first data packet 1128a is received there is a first time gap $t_{op}$ 1130a before a second data packet 1128b will be received. In some embodiments, since the sensor data rate and timing are not accurate, the ACU may measure a length of the first time gap $t_{gap}$ 1130a without placing a test signal within the first time gap $t_{gap}$ 1130a.

At time $t_3$, a second data packet 1128b is received from the sensors. After the second data packet 1128b is received, the ACU will then send a second test signal 1120b, at time $t_4$. The second test signal 1120b induces a second response 1126b that has a size that fits within a second time gap $t_{gap}$ 1130b equal to the first gap. In some embodiments, the size of the time gaps (e.g., 1130a, 1130b, etc.) may be continuously measured and the length of a subsequent test signal may be chosen based upon the size of time gaps measured over one or more of the previous period of data packet transmission.

FIG. 11C illustrates timing diagrams, 1132 and 1138, showing operation of a disclosed automotive control unit configured to determine a load response of a sensor network using an asynchronous protocol for an ABS (automatic braking system) sensor.

At time $t_0$, the ACU is turned on and the ACU begins to transmit a communication signal 1134 comprising a modulated voltage to one or more sensors. In some embodiments, an initial characterization of bus can be performed by generating a first test signal 1136a comprising a modulated voltage, at time $t_1$. In response to the first test signal 1136a, a first response 1142a comprising a modulated current, is induced by the sensors.

A sensor waits for a certain time Δt after receiving a supply voltage and then automatically transmits a first data pulse 1144a. At time $t_2$, the first data pulse 1144a is received from the sensors. After a first data pulse 1144a is received there is a time gap $t_{gap1}$ 1146a before a next data pulse will be received. It will be appreciated that the ABS sensors send data pulses that denote edges of a magnetic pole wheel undergo zero crossings. Therefore, as the speed of an automobile changes the gap between data pulses varies (e.g., the faster the car is driving the faster the pole wheel, so that the distance between the zero crossings is getting closer). Since the distance between data pulses is variable the ACU may measure a length of the first time gap $t_{gap1}$ 1146a without placing a test signal within the first time gap.

At time $t_3$, a second data pulse 1144b is received from the sensors. After the second data pulse 1144b is received, the ACU will then send a second test signal 1136b that induces a second response 1142b having a size that fits within a second time gap $t_{gap2}$ 1146b. Since the size of the second time gap $t_{gap2}$ 1146b depends on the speed of an automobile, the second test signal 1136b may be placed within the second time gap $t_{gap2}$ 1146b along with some additional margin $t_{th}$ that insures that the second test signal 1136b and the second response 1142b don't interfere with a third data pulse 1144c, even in the case of the automobile running at a maximum acceleration. In some embodiments, if an automobile is running too fast, the ECU may have to suspend characterization until the automobile is driving slower again.

Figure 12A:
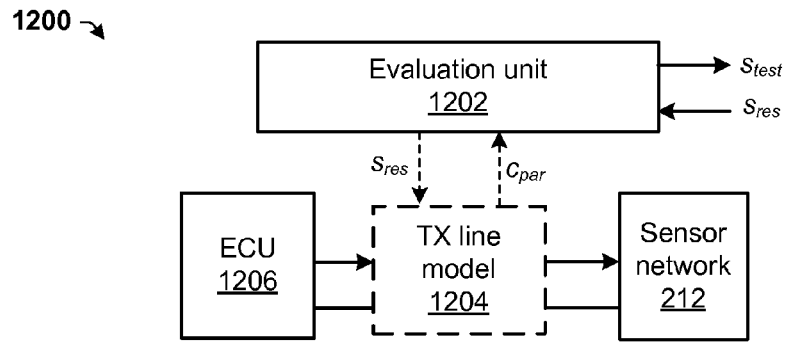
FIGS. 12A-12C illustrate block diagrams showing some embodiments of equivalent networks that can be used to characterize an impedance load.

FIG. 12A illustrates a block diagram 1200 illustrating the use of an equivalent network comprising a transmission line model 1204 to generate one or more characterization parameters.

As shown in block diagram 1200, an evaluation unit 1202 is configured to generate a test signal $s_{test}$ and to measure a response induced by the test signal $s_{test}$. The evaluation unit 1202 then evaluates the measured response by fitting a transmission line model 1204 configured between an ACU 1206 and a sensor network 212 to the measured response. Fitting the transmission line model 1204 to the measured response allows for values of the components of the transmission line to be determined and used as characterization parameters that characterize the sensor network. In some embodiments, the transmission line model 1204 may be stored in a memory element within the evaluation unit 1202.

In some embodiments, to determine components of the equivalent network, measurements will be taken at different frequencies, step responses, etc., to obtain enough data to characterize the sensor network. For example, with each frequency the bus evaluation unit will get back an amplitude of the response and the phase shift of the response. Therefore, to characterize an equivalent network having 6 unknown components will have to take measurement at three (3) different frequencies to get six (6) measurements.

Figure 12B:
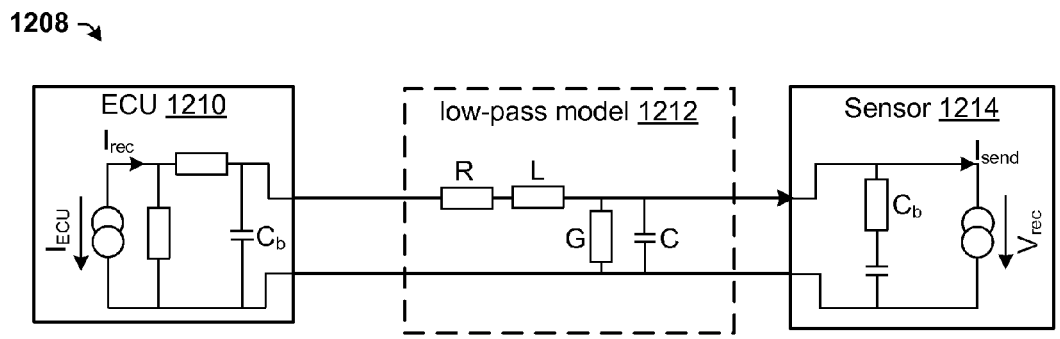
Figure 12C:
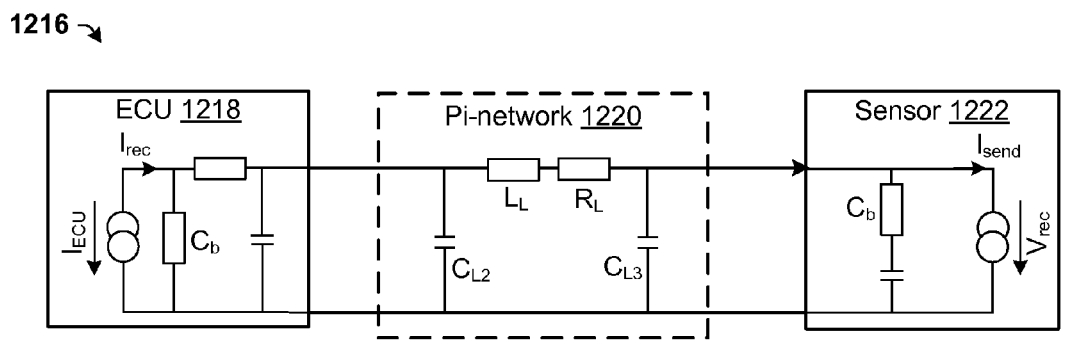

FIGS. 12B-12C illustrates some examples of equivalent networks that may be used to characterize a received response.

FIG. 12B illustrates a block diagram 1208 of an equivalent network comprising a lumped low-pass model network 1212.

The equivalent network comprises an ECU 1210 that provides a voltage to a sensor network 1214. In this case, the ECU 1210 comprises a regulated current source that changes the supply current depending on information from a control unit, and that changes the supply current in response to feedback from the output of the system in order to keep the voltage stable.

The network 1212 comprises a line inductance L, a line resistance R, and a line capacitance C. Different values of the low-pass model's components model variations in the length of a communication bus (e.g., between a few cm and 12 m). In some embodiments, blocking capacitors $C_b$ within the ECU 1210 and the sensor network 1214 may also be taken into account, as well as a resistor in series with the blocking capacitor in the sensor network 1214.

The network 1212 is accurate enough for ABS sensor since ABS systems use point to point sensor connections. Network 1212 may also be used for PSI5 and DSI3 communication protocols as well. The reason why these complex buses can be approximated with simple models is that buses having different resonance modes at different frequencies do not reach high Q factors for each resonance, since the other network branches which are not resonant at the same frequency provide additional damping. Furthermore, the resonance frequencies that are above the unity gain frequency of the control loop can be neglected since they are not relevant for the behavior of the control loop any more.

FIG. 12C illustrates a block diagram of an alternative equivalent network 1216 comprising an alternative transmission line model comprising a pi network 1220.

The alternative equivalent network 1216 comprises an ECU 1218 that provides a voltage to a sensor network 1214. The pi network 1220 comprises a line inductance L, a line resistance R, and a line capacitance that is split between capacitors $C_{L2}$ and $C_{L3}$. Different values of the transmission in the length of a communication bus components model variations in the line length. In some embodiments, a blocking capacitor $C_b$ within the ECU 1210 and the network sensor 1222 is taken into account, as well as a resistor in series with the blocking capacitor in the sensor network 1214.

It will be appreciated that the disclosed characterization is not limited to the equivalent circuits illustrated in FIGS. 12B-12C. Instead, the illustrated transmission line models are non-limiting models and that different equivalent network models may be used for communication bus. For example, in some embodiments, an equivalent network model may comprise a T-network, or for more accurate detail implementations as a transmission real line model based on the telegraph differential equation.

In some embodiments, a same functionality as an equivalent network can be achieved using a transfer function model that describes the load of a sensor network with poles and zeroes. This is because an ECU can be set up using information about a location of poles and zeros. For example, if the evaluation unit measures a transfer function or an impedance function with a periodic signal it can also directly find locations of poles and zeros from the response.

In some embodiments, the functionality of the load of a sensor network can be determined by inclusion of internal transfer functions (e.g., of the control loop, output driver stage, etc.) into the model. Such embodiments can provide for an accurate characterization of the load if the internal analog parts of the control loop have a fabrication spread, a temperature dependence, or aging effects that have a not negligible influence on the performance of the control loop.

Figure 13:
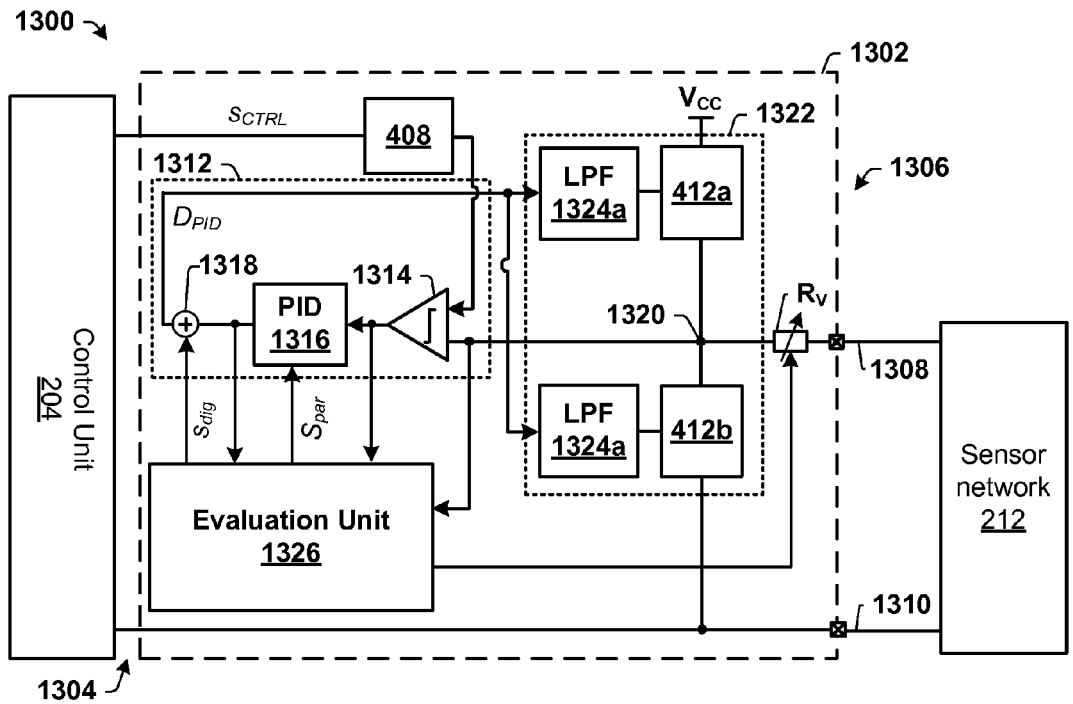
FIG. 13 is a block diagram of some additional embodiments of a disclosed automotive control unit configured to characterize an impedance load of a sensor network.

FIG. 13 is a block diagram of some additional embodiments of a vehicular sensor system 1300 comprising a sensor interface module 1302 configured to characterize a sensor network 212 and to selectively adjust operation of the sensor interface module 1302 based upon the characterization.

The sensor interface module 1302 has a control unit interface 1304 that interfaces to a control unit 204 and a sensor interface 1306 that interfaces to the pair of wires 1308, 1310 coupled to the sensor network 212. The sensor interface module 1302 further comprises a reference voltage source 408 configured to receive a control signal $S_{CTRL}$ from control unit 204 and to generate a variable reference signal $V_{ref}$ based thereupon.

The reference voltage source 408 is coupled to a closed control loop 1312. In some embodiments, the closed control loop 1312 comprises a comparison element 1314 and a PID (proportional-integral-derivative) controller 1316. The comparison element 1314 (e.g., a comparator, an analog-to-digital converter) has a first input connected to the reference voltage source 408 and a second input configured to receive a feedback signal from output node 1320. An output signal of the comparison element 1314 is coupled to an input of the PID controller 1316, which is configured to generate a digital control signal $D_{PID}$ that drives the output driver stage 1322 to regulate an output voltage at output node 1320 to match the variable reference voltage $V_{ref}$.

An evaluation unit 1326 is configured to have access to output node 1320, the output of comparator 1314, and to the control signals output of the PID controller 1316. Since the PID controller 1316 controls the supply current via digitally controlled current sources, the PID controller output can be seen as a measurement of the current.

It will be appreciated that the evaluation unit 1326 may generate the test signal $s_{test}$ in a variety of ways. In some embodiments, the evaluation unit 1326 can generate current signals by varying operating parameters $S_{par}$ of the PID controller 1316. In some embodiments, the evaluation unit 1326 can generate current signals (current steps, periodic current signals, random current) by adding a digital signal $s_{dig}$ directly to the digital control signal $D_{PID}$ via adder 1318 (e.g., to increase current of high side source so that current delivered is higher than current that is drawn by sensor).

The evaluation unit 1326 may be configured to take into account the response of other components of the sensor interface module 1302 when characterizing the sensor network 212. For example, in some embodiments, the output driver stage 1322 may comprise one or more low pass filters 1324 located between the closed control loop 1312 and current sources 412 in the output driver stage 1322. The poles of the low pass filters 1324 have a behavior that depends on parameters of MOS transistors which have significant fabrication spread and temperature dependence. Therefore, to accurately characterize the sensor network, the transfer function of the output driver stage 1322 may also be characterized along with the response of the sensor network 212.

For example, in order to separate the evaluation of internal and external transfer functions the evaluation unit 1326 may characterize the transfer function of the low pass filters 1324 before the normal bus operation is started. The transfer function of the low-pass filters 1324 may be determined from a design or by taking additional measurements of the system. In some embodiments, the sensor interface module 1302 may comprise a variable resistor $R_v$ having a known resistance. By changing the value of the variable resistor $R_v$, measurements can be taken that are used to characterize the low pass filter transfer function first and then the evaluation unit 1326 can characterize the load impedance of the sensor network 212. Alternatively, changes of the value of the variable resistor $R_v$ can be made to influence the resonance behavior of the external network (e.g., to characterize the capacitive load with a higher resistance and then to reduce the resistance to increase the Q factor of a resonance to extract the inductance from the resonance frequency). In other embodiments, the sensor interface module 1302 may measure parameters at different frequencies to first characterize internal components and then characterize load impedance of the sensor network 212 based on the knowledge about the internal component.

Figure 14:
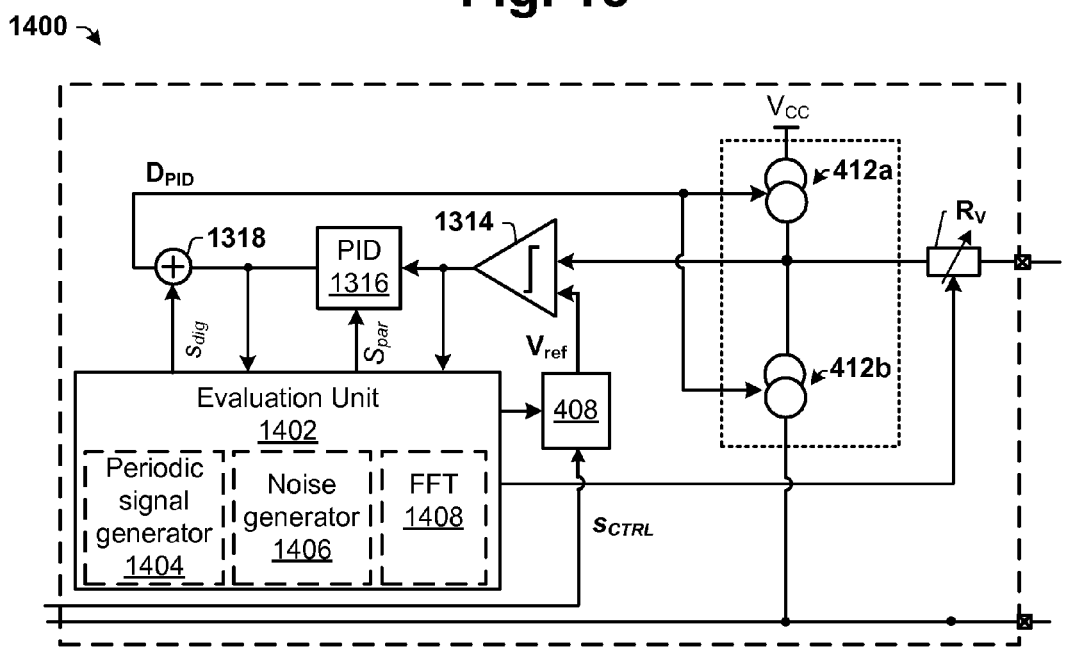
FIG. 14 is a block diagram of an alternative embodiment of a disclosed automotive control unit configured to characterize an impedance load of a sensor network.

FIG. 14 is a block diagram of an alternative embodiment of a disclosed sensor interface module 1400.

The sensor interface module 1400 comprises an evaluation unit 1402 that may be configured to perform a network characterization according to a number of different embodiments. It will be appreciated the following embodiments are non-limiting embodiments that can be used to perform a network characterization and that additional embodiments, or combinations of the following embodiments may be used.

In some embodiments, the evaluation unit 1402 may be configured to measure a response of a supply voltage on a slight increase of a supply current. Since the current consumption of sensors can be assumed to be constant for small supply voltage variations, a current delivered that is higher than the current consumed by the sensors will cause an increase in voltage at output node. Therefore, by evaluating the slew rate (e.g., slope of slew rate) information about resonance (e.g., capacitance and inductance) can be achieved by characterizing the overshoot of the delivered current higher than the actual current consumption of the sensors. For example, the slope of the supply voltage increase after a first settling time will be reciprocal to the sum of capacitors in the sensor network. The initial oscillations that are observed directly after the application of the current step deliver further information about the inductance and the distribution of the capacitors.

In some alternative embodiments, the evaluation unit 1402 may be configured to apply a voltage step on the reference voltage and measure the step response of the control loop recording the current and/or the voltage. From the voltage and current information about the sensors (e.g., capacitance and inductance) can be achieved.

In other alternative embodiments, the evaluation unit 1402 may be configured to stimulate the sensor network with a periodic signal and to measure a gain and/or a phase shift of the response. For example, the evaluation unit 1402 may comprise a period signal generator 1404 configured to generate a test signal comprising a periodic signal (e.g., a periodic sinusoidal signal). The evaluation unit 1402 is configured to characterize the response at different frequencies. With every frequency, the evaluation unit 1402 will get back an amplitude and a phase shift of a response. Therefore, each frequency measurement gives information that can be used to fit an equivalent network.

In some embodiments, the periodic signal may comprise a sinusoid signal. In such embodiments, the transfer function of the load network can be determined directly from the response. In other embodiments, the periodic signal may comprise simplified approximations of a sinusoidal signal comprising triangular or rectangular signals. In some embodiments, the simplified approximations may be filtered by filters configured to remove unwanted harmonics.

In other alternative embodiments, the evaluation unit 1402 may be configured to stimulate the sensors with noise. For example, the evaluation unit 1402 may comprise a noise generator 1406 configured to generate a test signal comprising noise (e.g., random or pseudorandom signals). The evaluation unit 1402 is configured to record the noise and the response (e.g., the injected noise current and resulting voltage response or noise generated on the supply voltage and induced current changes). The evaluation unit 1402 is further configured to perform a spectral analysis on both the noise and the response by operating a FFT block 1408 to perform a fast Fourier transform of the noise and the response. The transfer function can be calculated as a quotient of both spectra.

In other alternative embodiments, the evaluation unit 1402 may be configured to provoke native oscillation of the voltage controller and measure the oscillation period to determine the dominant parallel resonance frequency of the load. The native oscillations provoke an instability of a control unit, thereby decreasing a stability of the control unit (e.g., by increasing frequency of dominant pole). If the stability is decrease in a step-by-step manner, oscillation will appear at resonance frequency.

In some embodiments, the evaluation unit 1402 may be configured to provoke native oscillations by reducing the value or even changing the sign of an emulated resistor $R_v$ from positive to negative. In other embodiments, the evaluation unit 1402 may be configured to provoke native oscillations by changing the phase margin of the closed control loop using the operating parameters $S_{par}$. In order to avoid a misinterpretation of the oscillations by the sensors the oscillation amplitude can be limited by controlling the operating parameters $S_{par}$ that initiate the oscillation based on current or voltage feedback signals.

It will be appreciated that equivalent alterations and/or modifications may occur to those skilled in the art based upon a reading and/or understanding of the specification and annexed drawings. The disclosure herein includes all such modifications and alterations and is generally not intended to be limited thereby.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. An automotive control unit (ACU), comprising:
    a control unit configured to selectively generate a plurality of control signals corresponding to a plurality of different communication protocols;
    a modulation unit configured to receive one of the plurality of control signals, to generate modulated communication signals having characteristics that correspond to the plurality of different communication protocols based on the plurality of control signals, and to provide each of the modulated communication signals to a shared communication bus at different times; and
    wherein the shared communication bus is configured to provide the modulated communication signals to a sensor network comprising one or more sensors.

2. The ACU of claim 1, wherein the modulated communication signals comprise:
    a first communication protocol having a first plurality of pulses that have increased by a first voltage value; and
    a second communication protocol having a second plurality of pulses that have decreased by a second voltage value.

3. The ACU of claim 2, wherein the modulation unit is configured to initially send a first signal having the second communication protocol and to subsequently send a second signal having the first communication protocol.

4. The ACU of claim 1, wherein the shared communication bus comprises a two wire communication bus having a first bus wire connected between the modulation unit and sensor network and a second bus wire connected between the modulation unit and the sensor network.

5. The ACU of claim 4, further comprising:
    a voltage modulation unit configured to generate the modulated communication signals by modulating a voltage on the shared communication bus; and
    a current demodulation unit configured to demodulate a modulated current received from the sensor network.

6. The ACU of claim 1, further comprising:
    an evaluation unit configured to send a test signal to the sensor network, measure a response of the test signal induced by the sensor network, and determine one or more characterization parameters of the sensor network based upon the measured response.

7. The ACU of claim 6, wherein the test signal comprises a voltage modulation having a voltage variation value that is less than a voltage variation value of a synchronization pulse corresponding to one of the plurality of different communication protocols.

8. The ACU of claim 6,
wherein the evaluation unit is configured to send the test signal during a time window that is free of data communication between the sensor network and the ACU; and
wherein a length of the test signal is selected based upon measured sizes of one or more previous time windows that are free of data communications between the sensor network and the ACU.

9. The ACU of claim 6, wherein the test signal comprises a voltage modulation having a synchronization pulse with characteristics that correspond to a first communication protocol, so that the test signal can be used to determine if the first communication protocol is being used by the sensor network.

10. The ACU of claim 9,
wherein the evaluation unit is configured to determine that the sensor network is using the first communication protocol if a response to the first communication protocol is received from the sensor network; and
wherein the evaluation unit is configured to determine that the sensor network is not using the first communication protocol if the response to the first communication protocol is not received from the sensor network.

11. The ACU of claim 1, wherein the modulation unit comprises:
a closed control loop configured to generate a digital control signal based upon a variable reference voltage; and
an output driver stage having an input node configured to receive the digital control signal from the closed control loop and comprising a high-side current source and a low side current source coupled to an output node configured to output the modulated communication signals.

12. A sensor system, comprising:
a sensor interface module configured to generate a test signal that is provided to a sensor network comprising one or more sensors;
an evaluation unit configured to characterize an electrical behavior of the sensor network by operating the sensor interface module to send the test signal to the sensor network, measuring a response of the test signal induced by the sensor network, and determining one or more characterization parameters that describe the electrical behavior of the sensor network based upon the measured response;
wherein the evaluation unit is configured to send the test signal within an open time window free of data communication between the sensor interface module and the sensor network; and
wherein a length of the test signal is selected based upon measured sizes of one or more previous open time windows that are free of data communication between the sensor interface module and the sensor network.

13. The sensor system of claim 12, wherein determining the one or more characterization parameters is performed by fitting an equivalent network, configured to model the sensor network, to the measured response.

14. The sensor system of claim 12, wherein the one or more characterization parameters comprise a complex impedance of an impedance load of the sensor network, one or more components of an equivalent network that describes the impedance load, or one or more components of a transfer function that describes the impedance load.

15. The sensor system of claim 12, wherein the evaluation unit is configured to operate the sensor interface module to generate the test signal as a modulated voltage that varies by a voltage value that is less than a minimum amplitude of a synchronization pulse of an associated communication protocol.

16. The sensor system of claim 12, wherein the evaluation unit is configured to operate the sensor interface module to generate the test signal as a modulated current by varying a supply current of the sensor interface module.

17. The sensor system of claim 12, wherein the evaluation unit is configured to determine the one or more characterization parameters based upon multiple test signals sent during separate open time windows that are free of data communication between the sensor interface module and the sensor network.

18. The sensor system of claim 12, wherein the evaluation unit is configured to adjust operation of the sensor interface module based upon the one or more characterization parameters to improve a performance of the sensor interface module.

19. The sensor system of claim 18, wherein the evaluation unit is configured to adjust operation of the sensor interface module based upon one or more characterization parameters collected from a plurality of temporally separate characterization acts.

20. The sensor system of claim 12, further comprising:
a control unit configured to operate the sensor interface module to selectively generate a plurality of modulated communication signals having characteristics corresponding to a plurality of different communication protocols, and to provide the plurality of modulated communication signals to a shared bus at different times.

21. The sensor system of claim 20, wherein the test signal comprises a voltage modulation having a synchronization pulse with characteristics that correspond to a first communication protocol, so that the test signal can be used to determine if the first communication protocol is being used by the sensor network.

22. The sensor system of claim 21,
wherein the evaluation unit is configured to determine that the sensor network is using the first communication protocol if a response to the first communication protocol is received from the sensor network; and
wherein the evaluation unit is configured to determine that the sensor network is not using the first communication protocol if the response to the first communication protocol is not received from the sensor network.

23. The sensor system of claim 20, further comprising:
a closed control loop configured to generate a digital control signal based upon a variable reference voltage; and
an output driver stage having an input node configured to receive the digital control signal from the closed control loop and comprising a high-side current source and a low side current source coupled to an output node configured to output the plurality of modulated communication signals.

24. A method of detecting a communication protocol being used by sensors connected to an automotive control unit (ACU), comprising:
selectively generating a plurality of control signals corresponding to a plurality of different communication protocols, wherein respective control signals have characteristics corresponding to one of the plurality of different communication protocols;

generating a plurality of modulated communication signals based upon the plurality of control signals, which have characteristics that correspond to the plurality of different communication protocols; and providing each of the plurality of modulated communication signals to a shared bus at different times, wherein the shared bus provides the plurality of modulated communication signals to a sensor network comprising one or more sensors.

25. The method of claim 24, wherein the plurality of different communication protocols comprise:
   a first communication protocol having a first plurality of pulses that have increased by a first voltage value; and
   a second communication protocol having a second plurality of pulses that have decreased by a second voltage value.

26. A method of characterizing an electrical behavior of a sensor network, comprising:
   generating a test signal based upon one or more controller parameters using a closed control loop;
   sending the test signal to a sensor network comprising one or more sensors;
   measuring a response of the test signal induced by the sensor network; and
   determining one or more characterization parameters that describe an electrical behavior of the sensor network from the measured response.

27. The method of claim 26,
   wherein operation of the closed control loop is adjusted based upon one or more characterization parameters collected from a plurality of temporally separate characterization acts.

28. The method of claim 26, wherein a length of the test signal is selected based upon measured sizes of one or more previous open time windows that are free of data communication between the closed control loop and the sensor network.

29. The method of claim 26, wherein the test signal comprises a modulated voltage that varies by a voltage value that is less than a minimum amplitude of a synchronization pulse of an associated communication protocol.

30. The method of claim 26, wherein the test signal comprises a modulated current.

31. The method of claim 26, further comprising:
   adjusting operation of the closed control loop based upon the one or more characterization parameters.

* * * * *